(12) United States Patent
Hasegawa et al.

(10) Patent No.: US 12,017,261 B2
(45) Date of Patent: Jun. 25, 2024

(54) PROCESSING APPARATUS AND CLEANING PROCESSING METHOD

(71) Applicant: Tokyo Electron Limited, Tokyo (JP)

(72) Inventors: Tomoya Hasegawa, Yamanashi (JP); Masaki Kurokawa, Iwate (JP); Masami Oikawa, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/964,554

(22) Filed: Oct. 12, 2022

(65) Prior Publication Data

US 2023/0124143 A1 Apr. 20, 2023

(30) Foreign Application Priority Data

Oct. 19, 2021 (JP) .................................. 2021-171169

(51) Int. Cl.
*B08B 9/08* (2006.01)
*B08B 13/00* (2006.01)
*C23C 16/42* (2006.01)
*C23C 16/44* (2006.01)
*H01J 37/32* (2006.01)

(52) U.S. Cl.
CPC ................ *B08B 9/08* (2013.01); *B08B 13/00* (2013.01); *C23C 16/42* (2013.01); *C23C 16/4405* (2013.01); *B08B 2209/08* (2013.01); *H01J 37/32862* (2013.01)

(58) Field of Classification Search
CPC ....... B08B 13/00; B08B 9/08; B08B 2209/08; C23C 16/42; C23C 16/4405; H01J 37/32862
See application file for complete search history.

(56) References Cited

U.S. PATENT DOCUMENTS

| 2006/0115590 A1* | 6/2006 | Suzuki | ................ C23C 16/4405 118/726 |
| 2009/0133715 A1* | 5/2009 | Maekawa | ............. B08B 7/0035 134/4 |

FOREIGN PATENT DOCUMENTS

| JP | 2021-061349 A | 4/2021 | |
| WO | WO-2012024131 A2 * | 2/2012 | ............... B08B 3/04 |

* cited by examiner

*Primary Examiner* — Benjamin L Osterhout
(74) *Attorney, Agent, or Firm* — Venjuris, P.C.

(57) ABSTRACT

A processing apparatus includes: a processing container; a temperature sensor that detects a temperature therein; a gas supply unit that supplies a cleaning gas into the processing container; a pressure regulation unit that regulates a pressure in the processing container; and a control unit that controls the gas supply unit and the pressure regulation unit to perform a cleaning processing of removing a deposited film in the processing container. The control unit stores a vapor pressure curve in which the temperature in the processing container is associated with a vapor pressure of water in the processing container. In the cleaning processing, the control unit sets a target pressure below the vapor pressure curve based on the temperature detected by the temperature sensor and the vapor pressure curve, and controls the pressure regulation unit such that the pressure in the processing container becomes the target pressure.

9 Claims, 7 Drawing Sheets

FIG. 3

| | APPARATUS A | APPARATUS B | APPARATUS C | APPARATUS D | APPARATUS E |
|---|---|---|---|---|---|
| TEMPERATURE IN PROCESSING CONTAINER DURING CLEANING PROCESSING | 32°C | 30°C | 36°C | 38°C | 34°C |

 EXTRACTION OF VAPOR PRESSURE

| | APPARATUS A | APPARATUS B | APPARATUS C | APPARATUS D | APPARATUS E |
|---|---|---|---|---|---|
| VAPOR PRESSURE DURING CLEANING PROCESSING | 35.7 Torr | 31.8 Torr | 44.6 Torr | 49.7 Torr | 39.9 Torr |

 CALCULATION OF TARGET PRESSURE

| | APPARATUS A | APPARATUS B | APPARATUS C | APPARATUS D | APPARATUS E |
|---|---|---|---|---|---|
| TARGET PRESSURE DURING CLEANING PROCESSING | 30 Torr | 26 Torr | 39 Torr | 44 Torr | 34 Torr |

| POSITION | TEMPERATURE |
|---|---|
| TOC | 34°C |
| C-T | 33°C |
| CTR | 32°C |
| C-B | 31°C |
| BTM | 30°C |

⇩ CALCULATE AVERAGE

OUTPUT 32 °C AS DETECTED TEMPERATURE

PROCESSING APPARATUS AND CLEANING PROCESSING METHOD

CROSS-REFERENCE TO RELATED APPLICATION

This application is based on and claims priority from Japanese Patent Application No. 2021-171169 filed on Oct. 19, 2021 with the Japan Patent Office, the disclosure of which is incorporated herein in its entirety by reference.

TECHNICAL FIELD

The present disclosure relates to a processing apparatus and a cleaning processing method.

BACKGROUND

A processing apparatus performs a substrate processing such as forming a film on a substrate accommodated in a processing container. Since a film is also deposited inside the processing container as the substrate is processed, the processing apparatus performs a cleaning processing at appropriate timings. For example, in the cleaning processing, the processing apparatus etches (removes) the deposited film by supplying a cleaning gas into the processing container.

Japanese Patent Laid-Open Publication No. 2021-061349 discloses a technique of calculating an etching rate based on the temperature in the processing container and setting an etching time based on the calculated etching rate in order to suppress over-etching in the cleaning processing.

SUMMARY

According to an aspect of the present disclosure, a processing apparatus includes: a processing container; a temperature sensor that detects a temperature in the processing container; a gas supply unit that supplies a cleaning gas into the processing container; a pressure regulation unit that regulates a pressure in the processing container; and a control unit that controls the gas supply supply unit and the pressure regulation unit to perform a cleaning processing of removing a deposited film in the processing container. The control unit stores, in a storage, a vapor pressure curve in which the temperature in the processing container is associated with a vapor pressure of water in the processing container. In the cleaning processing, the control unit refers to the storage, sets a target pressure below the vapor pressure curve based on the temperature detected by the temperature sensor and the vapor pressure curve, and controls the pressure regulation unit such that the pressure in the processing container becomes the target pressure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a chart illustrating temperatures of a processing container during a cleaning processing.

DETAILED DESCRIPTION

Figure 1:
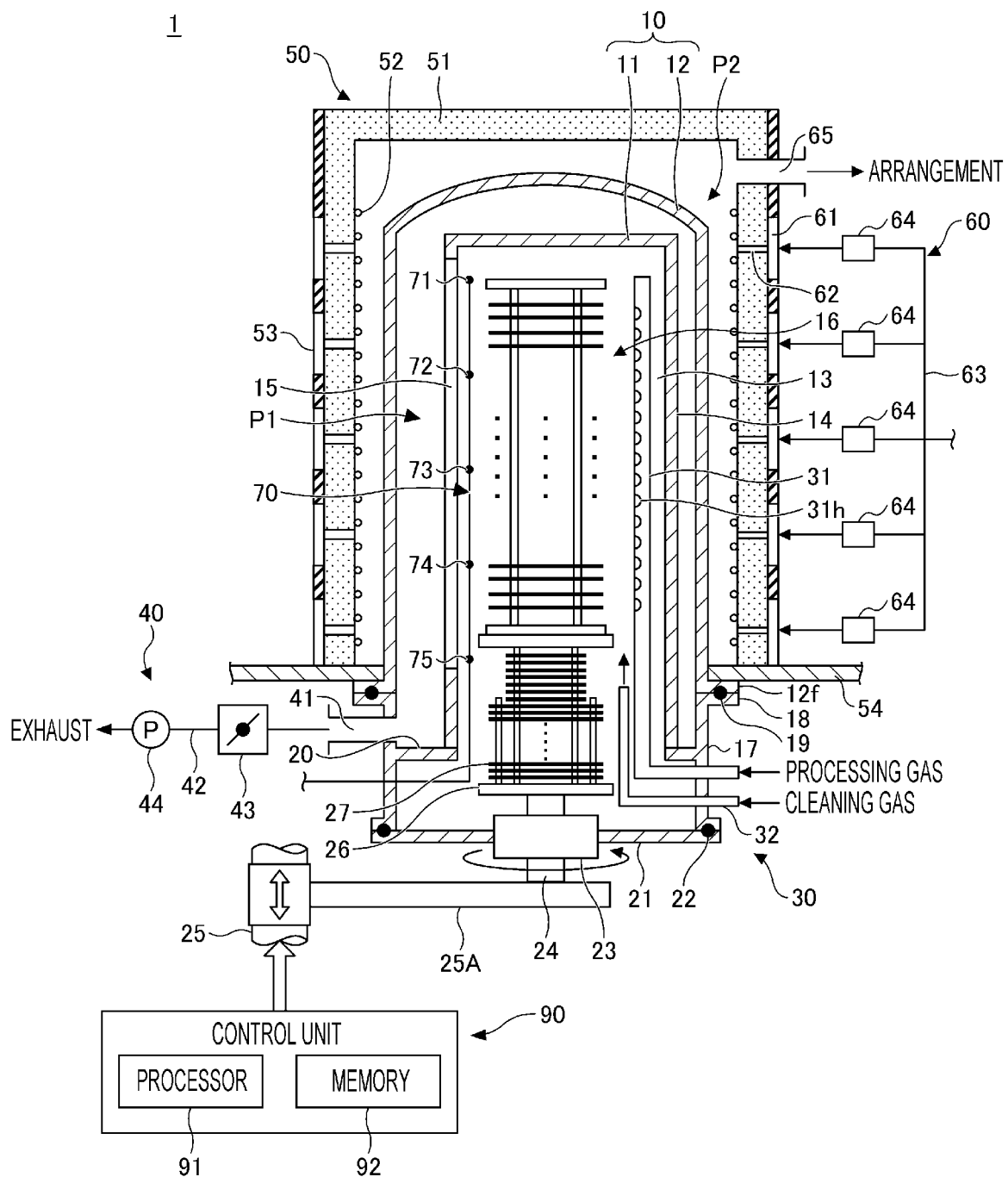
FIG. 1 is a diagram schematically illustrating a configuration example of a processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the accompanying drawings. In each of the drawings, the same components may be designated by the same reference numerals and duplicate descriptions thereof may be omitted.

[Processing Apparatus]

FIG. 1 is a diagram schematically illustrating a configuration example of a processing apparatus 1 according to an embodiment. As illustrated in FIG. 1, the processing apparatus 1 according to the embodiment is a vertical processing apparatus in which a plurality of substrates W is disposed in a vertical direction and a substrate processing such as a film formation is performed on each of the substrates. The substrate W may be, for example, a silicon wafer, a semiconductor substrate such as a compound semiconductor wafer, or a glass substrate.

The processing apparatus 1 includes a processing container 10, a gas supply unit 30, an exhaust unit 40, a heating unit 50, a cooling unit 60, a temperature sensor 70, and a control unit 90.

The processing container 10 is formed in a cylindrical shape capable of accommodating a plurality of substrates W along the vertical direction. For example, the processing container 10 includes a cylindrical inner cylinder 11 having a ceiling and an open lower end, and a cylindrical outer cylinder 12 that covers the outside of the inner cylinder 11 and has a ceiling and an open lower end. The inner cylinder 11 and the outer cylinder 12 are made of a heat-resistant material such as quartz, and have a double structure arranged coaxially with each other. The processing container 10 is not limited to a double structure and may have a single-cylinder structure or a multiple structure having three or more cylinders.

The inner cylinder 11 has a flat ceiling, while the outer cylinder 12 has a domed ceiling. A housing portion 13 for housing a gas nozzle 31 is formed along the vertical direction at a predetermined circumferential position of the inner cylinder 11. As an example, the housing portion 13 is formed inside a convex portion 14 formed by a part of the side wall of the inner cylinder 11 projecting radially outward.

A vertically elongated opening 15 is formed in the side wall of the inner cylinder 11 opposite to the housing portion 13. The opening 15 exhausts the gas in the inner cylinder 11 to a space P1 between the inner cylinder 11 and the outer cylinder 12. The vertical length of the opening 15 may be the same as the vertical length of a wafer boat 16 or larger than the wafer boat 16 in the vertical direction.

A lower end of the processing container 10 is supported by a cylindrical manifold 17 made of, for example, stainless steel. A flange 18 is formed at the upper end of the manifold 17, and the flange 18 supports a flange 12f at the lower end of the outer cylinder 12. A sealing member 19 is provided between the flange 12f and the flange 18 to airtightly seal the insides of the outer cylinder 12 and the manifold 17.

An annular support portion 20 projects radially inward from the inner wall of the upper portion of the manifold 17, and supports the lower end of the inner cylinder 11. A cover 21 is airtightly attached to the opening at the lower end of the manifold 17 via a sealing member 22. That is, the cover 21 airtightly closes the opening of the manifold 17 on the lower end. The cover 21 is made of, for example, stainless steel in a flat plate shape.

A rotary shaft 24 that rotatably supports the wafer boat 16 passes through the central portion of the cover 21 via a magnetic fluid seal portion 23. A lower portion of the rotary shaft 24 is supported by an arm 25A of an elevating mechanism 25 constituted by a boat elevator. The processing apparatus 1 moves up and down together with the cover 21 and the wafer boat 16 by moving the arm 25A of the elevating mechanism 25 up and down, so that the wafer boat 16 may be inserted into and removed from the processing container 10.

A rotary plate 26 is provided at the upper end of the rotary shaft 24, and the wafer boat 16 holding the substrates W is placed on the rotary plate 26 via a heat insulation unit 27. The wafer boat 16 is a substrate holder that holds the substrates W at predetermined intervals in the vertical direction. The wafer boat 16 holds each of the substrates W horizontally.

Figure 2:
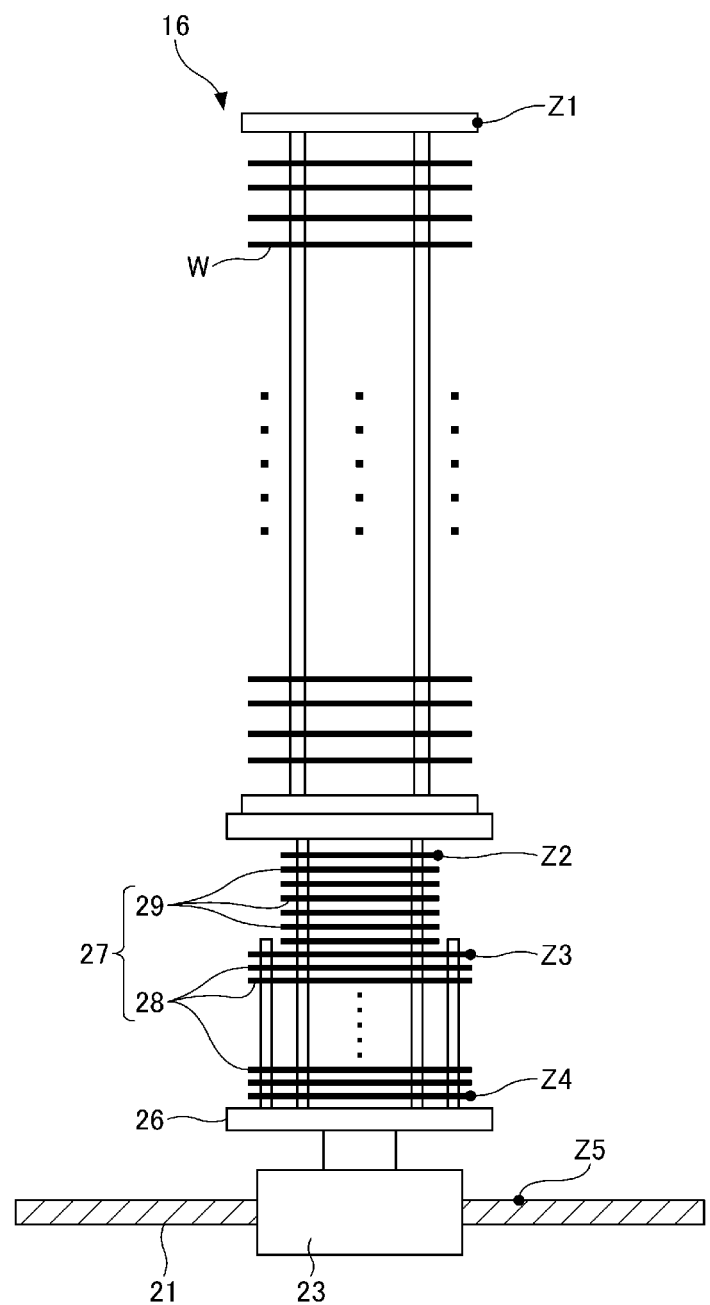
FIG. 2 is a diagram illustrating an enlarged configuration of a wafer boat, a cover, and a heat insulation unit.

FIG. 2 is a diagram illustrating an enlarged configuration of the wafer boat 16, the cover 21, and the heat insulation unit 27. The heat insulation unit 27 is configured by disposing a plurality of large fins 28 made of, for example, quartz in a shelf shape and disposing a plurality of small fins 29 made of a heat insulating material smaller than the size of the large fins 28, for example, quartz in a shelf shape above the plurality of large fins 28. The size of the large fins 28 is set to approximately the same diameter as the substrate W.

The heat insulation unit 27 is disposed at a location where the temperature change is relatively large in the processing container 10 due to the presence of the entrance/exit of the gas supply unit 30 and the exhaust unit 40 or other temperature change elements in the vicinity of the sides thereof. The heat insulation unit 27 insulates the temperature changes, thereby stabilizing the temperature in the processing container 10 above the heat insulation unit 27.

Referring back to FIG. 1, the gas supply unit 30 is inserted into the processing container 10 via the manifold 17. The gas supply unit 30 introduces gases such as a processing gas, a cleaning gas, and a purge gas into the inner cylinder 11. For example, the gas supply unit 30 includes a gas nozzle 31 that introduces the processing gas and the purge gas, and a gas nozzle 32 that introduces the cleaning gas.

The gas nozzle 31 is made of quartz, extends in the vertical direction inside the inner cylinder 11, and is bent in an L shape at the lower end thereof to penetrate the manifold 17 from inside to outside. The gas nozzle 31 includes a plurality of gas holes 31h at predetermined intervals along the vertical direction, and discharges gas horizontally through each of the gas holes 31h. The predetermined interval is set to be the same as, for example, an interval between the wafers W supported on the wafer boat 16. Further, the vertical position of the gas hole 31h is set to be located in the middle between the substrates W adjacent to each other in the vertical direction, and the gas may be smoothly circulated in the space between the substrates W.

The gas nozzle 31 is, for example, an injector pipe that supplies a processing gas and a purge gas, and the gas supply unit 30 supplies the processing gas and the purge gas into the processing container 10 while controlling the flow rate outside the processing container 10. An appropriate processing gas may be selected according to the type of film to be formed on the substrate W. When forming a silicon oxide film, for example, a silicon-containing gas such as dichlorosilane (DCS) gas and an oxidizing gas such as ozone ($O_3$) gas may be used as the processing gas. For example, nitrogen ($N_2$) gas and argon (Ar) gas may be used as the purge gas.

The gas nozzle 32 is made of quartz and is provided to extend vertically below the wafer boat 16. The gas nozzle 32 is bent in an L shape at the lower end thereof to penetrate the manifold 17 from inside to outside. The gas nozzle 32 has an open upper end and emits gas upward from the opening. The gas nozzle 32 is, for example, an injector pipe that supplies a cleaning gas and a purge gas. The gas supply unit 30 supplies the cleaning gas into the processing container 10 while adjusting the flow rate with a flow rate controller (not illustrated) installed outside the processing container 10. An appropriate cleaning gas may be selected according to the type of film to be formed in the processing container 10. When the film to be formed in the processing container 10 is a silicon oxide film, the cleaning gas includes, for example, fluorine-containing gases such as hydrogen fluoride (HF) gas, fluorine ($F_2$) gas, chlorine trifluoride ($ClF_3$) gas, and nitrogen trifluoride ($NF_3$) gas.

The gas supply unit 30 may be provided with a plurality of gas nozzles 31 to individually supply a plurality of types of processing gas or purge gas or may be configured to supply the processing gas, the cleaning gas, and the purge gas from one gas nozzle 31 into the processing container 10. In short, the number of gas nozzles 31 and 32 is not limited to the example of FIG. 1.

The exhaust unit 40 exhausts the gas in the processing container 10 to the outside. The gas supplied by the gas supply unit 30 flows out from the opening 15 of the inner cylinder 11 into the space P1 between the inner cylinder 11 and the outer cylinder 12 and is exhausted through a gas outlet 41. The gas outlet 41 is formed on the side wall of the upper portion of the manifold 17 and above the support portion 20. An exhaust path 42 of the exhaust unit 40 is connected to the gas outlet 41. The exhaust unit 40 includes a pressure regulating valve 43 and a vacuum pump 44 in order from upstream to downstream of the exhaust path 42. The exhaust unit 40 sucks gas in the processing container 10 with a vacuum pump 44 and regulates the flow rate of the exhausted gas with the pressure regulating valve 43 to adjust the pressure in the processing container 10.

The heating unit 50 is provided to cover the outside of the processing container 10 with a cylindrical heat insulating material 51 having a ceiling, and heats the substrates W in the processing container 10. The heat insulating material 51 is made mainly of silica and alumina. As an example, the heating unit 50 is attached to a base plate 54 supported by the flange 12f of the outer cylinder 12. The heating unit 50 is not particularly limited as long as the substrates W in the processing container 10 may be heated, and an infrared heater may be applied to heat the processing container 10 by radiating, for example, infrared rays. In this case, a linear heating element 52 is provided spirally or meanderingly on the inner circumference of the heat insulating material 51. The heating element 52 may be divided into a plurality of zones in the height direction of the heating unit 50 to control the temperature. Hereinafter, the plurality of zones will be referred to as "TOP," "C-T," "CTR," "C-B," and "BTM" in order from the top. The heating element 52 is held on the inner wall surface of the heat insulating material 51 via a holding portion (not illustrated).

In order to retain the shape of the heat insulating material 51 and to reinforce the heat insulating material 51, the outer circumference of the heat insulating material 51 is covered with a metal skin 53 such as stainless steel. Further, in order to suppress the heat effect on the outside of the heating unit 50, the outer circumference of the outer skin 53 is covered with a water cooling jacket (not illustrated).

The cooling unit 60 supplies a cooling fluid such as air toward the processing container 10 to cool the substrate W in the processing container 10. The cooling unit 60 supplies a cooling fluid toward the processing container 10, for example, when rapidly lowering the temperature of the substrate W after heat treatment. Further, the cooling unit 60 may supply the cooling fluid toward the inside of the processing container 10 in the cleaning processing of etching a deposited film inside the processing container 10. The cooling unit 60 includes a fluid flow path 61, a blowout hole 62, a distribution path 63, a cooling fluid flow rate regulating unit 64, and a heat exhaust port 65.

A plurality of fluid flow paths 61 is formed along the height direction and the circumferential direction of the outside (outer skin 53) of the heat insulating material 51. The blowout holes 62 are formed to penetrate the heat insulating material 51 from the respective fluid flow paths 61 and blow out the cooling fluid to a space P2 between the outer cylinder 12 and the heat insulating material 51. A plurality of distribution paths 63 is formed outside the outer skin 53 to distribute and supply the cooling fluid to each fluid flow path 61.

The cooling fluid flow rate regulating unit 64 is provided for each of the plurality of distribution paths 63 and regulates the flow rate of the cooling fluid supplied to the fluid flow path 61.

The heat exhaust port 65 is provided above the plurality of blowout holes 62 and exhausts the cooling fluid supplied into the space P2 to the outside of the processing apparatus 1. The cooling fluid discharged to the outside of the processing apparatus 1 is cooled by, for example, a heat exchanger (not illustrated) and supplied again to the distribution path 63. Alternatively, the cooling fluid discharged to the outside of the processing apparatus 1 may be discarded without being reused.

The temperature sensor 70 is provided inside the inner cylinder 11 and detects the temperature in the processing container 10. However, the temperature sensor 70 may be provided at a position where the temperature in the processing container 10 may be detected, for example, in the space P1 between the inner cylinder 11 and the outer cylinder 12. The temperature sensor 70 includes a plurality of (five in this embodiment) thermometers 71 to 75 at different positions in the height direction corresponding to the plurality of zones. The thermometers 71 to 75 are provided corresponding to zones "TOP," "C-T," "CTR," "C-B," and "BTM," respectively. A thermocouple or a temperature measurement resistor may be applied to the plurality of thermometers 71 to 75.

The temperature sensor 70 transmits the temperature detected by each of the plurality of thermometers 71 to 75 to the control unit 90.

A computer having one or more processors 91, a memory 92, an input/output interface (not illustrated), and an electronic circuit may be applied to the control unit 90 of the processing apparatus 1. The processor 91 is a combination of one or more of a CPU, an ASIC, an FPGA, and a circuit including a plurality of discrete semiconductors. The memory 92 includes a volatile memory and a non-volatile memory (e.g., a compact disk, a DVD, a hard disk, and a flash memory), and stores programs for operating the processing apparatus 1 and recipes (process conditions) for substrate processing and cleaning processing.

The processor 91 executes programs stored in the memory 92 to control each component of the processing apparatus 1 in the substrate processing. In the substrate processing, the processor 91 operates the elevating mechanism 25 to accommodate the wafer boat 16 on which a plurality of substrates W is disposed in the processing container 10. The cover 21 raised by the elevating mechanism 25 contacts the manifold 17 to airtightly seal the bottom of the processing container 10.

Then, the processor 91 reduces the pressure in the processing container 10 using the exhaust unit 40 and heats the processing container 10 using the heating unit 50. Further, the processor 91 controls the gas supply unit 30 to supply the processing gas into the inner cylinder 11 through the gas nozzle 31. At this time, the processor 91 adjusts the pressure in the processing container 10 by controlling the opening degree of the pressure regulating valve 43 of the exhaust unit 40 while sucking the processing gas with the vacuum pump 44. As a result, in the processing container 10, a substrate processing is performed in which an appropriate film is formed on the substrate W based on the heating of the substrate W and the processing gas supplied from the gas nozzle 31.

After completing the substrate processing, the processor 91 stops the supply of the processing gas into the processing container 10 and lowers the elevating mechanism 25 to separate the wafer boat 16 from the processing container 10. Further, by taking out each substrate W from the wafer boat 16 by a transfer apparatus (not illustrated), the processing apparatus 1 becomes ready for processing a new substrate.

As the substrate processing described above is performed, a deposition film is deposited in the processing container 10. For example, in the substrate processing for forming a silicon oxide film, $SiO_2$ is deposited as a deposited film. Such type of deposited film is deposited on the surfaces of the inner cylinder 11 and the outer cylinder 12, the gas nozzle 31, the gas outlet 41, and the exhaust path 42. For this reason, the processing apparatus 1 performs a cleaning processing for etching (removing) the deposited film during periodic maintenance.

In the cleaning processing, by supplying, for example, HF which is a fluorine-containing gas from the gas nozzle 32, $SiO_2$ and fluorine react with each other and are converted into silicon tetrafluoride ($SiF_4$) as represented in the reaction formula (1) below.

$$SiO_2(s) + 4HF(g) \rightarrow SiF_4 + 2H_2O(l) \qquad (1)$$

Further, the water generated in the reaction formula (1) reacts with hydrogen fluoride gas to produce hydrofluoric acid (HF(aq)) as represented in the reaction formula (2) below.

$$HF(g) + H_2O(l) \rightarrow HF(aq) \qquad (2)$$

Then, hydrofluoric acid may further etch the silicon oxide film as represented in the reaction formula (3) below.

$$SiO_2(s)+4HF(aq)\rightarrow SiF_4+6H_2O(l) \quad (3)$$

Here, the reaction rate of the reaction formula (1) is relatively small compared to the reaction rates of the reaction formulas (2) and (3). Therefore, water ($H_2O$) may be generated as steam to promote the reactions of the reaction formulas (2) and (3). As a result, the efficiency of the cleaning processing may be improved. However, when the generated water changes from gas (steam) to liquid (liquid water) and adheres to the walls inside the processing container 10, only the reaction at the portion is greatly accelerated, resulting in over-etching that causes damage or peeling off of $SiO_2$ that was originally coated in each component within the processing container 10. In other words, in order to uniformly etch the deposited film without causing etching unevenness in the cleaning processing, it is important to maintain the state of water vapor in the processing container 10. In the present specification, the phrase "etching unevenness" is not limited to a state in which over-etching occurs in a part of the internal structure of the processing container 10, but refers to a state in which the deposited film is unevenly removed in the cleaning processing.

Further, the processing apparatus 1 stops the operation of the heating unit 50 during the cleaning processing. Therefore, the temperature in the processing container 10 during the cleaning processing is affected by the surrounding environment (e.g., the environment of a clean room in a factory) in which the processing apparatus 1 is installed, and thus varies between apparatuses even for the same model.

FIG. 3 is a chart illustrating temperatures of the processing container 10 during the cleaning processing. For example, as illustrated in FIG. 3, the temperature of the processing container 10 of the processing apparatus 1 (apparatuses A to E) installed in a factory varies between about 30° C. and 38° C. when the heating unit 50 is in a non-operating state, depending on factory facility factors. In the cleaning processing, the processing apparatus 1 may operate the cooling unit 60. Even when the cooling unit 60 is operated, since the air supplied to the processing container 10 depends on the temperature of the surrounding environment, the processing container 10 performs the cleaning processing at a temperature corresponding to the surrounding environment.

As an example, when the processing apparatus 1 is installed near equipment that radiates a large amount of heat, the temperature in the processing container 10 naturally rises. Alternatively, when the processing container 10 is installed near air conditioning equipment, the temperature in the processing container 10 decreases due to the downflow of the air conditioning equipment. That is, the processing apparatus 1 performs the cleaning processing at different temperatures depending on the surrounding environment in which each apparatus is installed.

In the cleaning processing, when the cleaning processing is performed at different temperatures in the apparatuses A to E while maintaining the same pressure in the processing containers 10 of the apparatuses A to E, for example, in an apparatus with a low temperature, the reactions of the reaction formulas (1) to (3) proceed and liquid water is generated in the processing container 10. The liquid water may cause etching unevenness in the processing container 10. Therefore, the control unit 90 according to the present embodiment optimizes the cleaning processing by controlling the operation of the cleaning processing based on the temperature in the processing container 10 detected by the temperature sensor 70.

Figure 4:
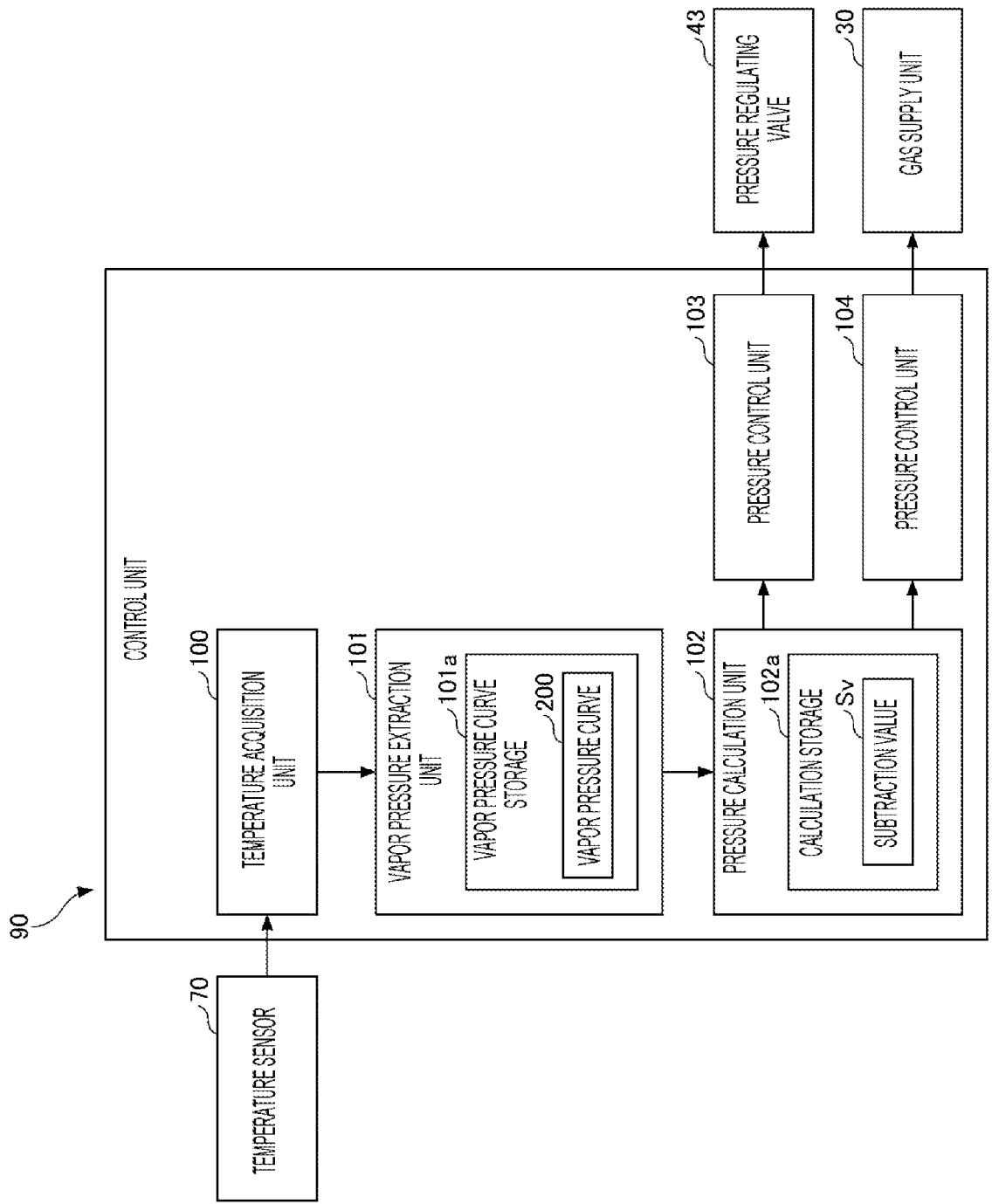
FIG. 4 is a block diagram illustrating functional blocks of a control unit for cleaning processing.

FIG. 4 is a block diagram illustrating functional blocks of the control unit 90 for cleaning processing. The processor 91 forms a temperature acquisition unit 100, a vapor pressure extraction unit 101, a pressure calculation unit 102, a pressure control unit 103, and a gas supply control unit 104 as illustrated in FIG. 4 under the execution of the program in the cleaning processing.

The temperature acquisition unit 100 acquires the detected temperature in the processing container 10 detected by the temperature sensor 70. As described above, the temperature sensor 70 has five thermometers 71 to 75, and the temperature acquisition unit 100 may acquire the temperature of each of five zones along the height direction of the wafer boat 16 using the temperature sensor 70. The temperatures within the processing container 10 detected by the temperature sensor 70 may be less than five (including one) or more than five.

Figures 5, 6:
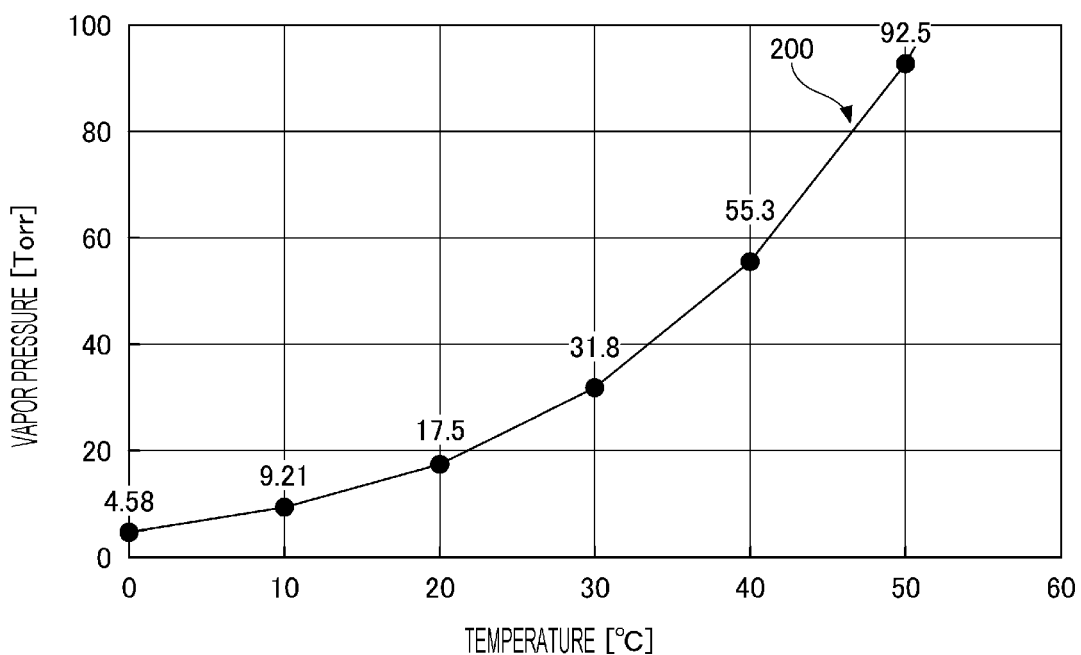
FIG. 5 is a chart illustrating an example of temperatures detected by a temperature sensor.
FIG. 6 is a graph illustrating a vapor pressure curve for water.

FIG. 5 is a diagram illustrating an example of temperatures detected by the temperature sensor 70. In the example of FIG. 5, the temperature at the "TOP" position is 34° C., the temperature at the "C-T" position is 33° C., the temperature at the "CTR" position is 32° C., the temperature at the "C-B" position is 31° C., and the temperature at the "BTM'"" position is 30° C. The temperature acquisition unit 100 also stores the detected temperature in the processing container 10 acquired from the temperature sensor 70 in the memory 92.

Further, when the temperature of each of the five zones is detected, the temperature acquisition unit 100 selects or calculates one detected temperature to be output to the vapor pressure extraction unit 101 based on the detected temperatures stored in the memory 92. At this time, the temperature acquisition unit 100 may calculate an average value or a median value of the temperatures for each of the five zones, or may select the maximum temperature and the minimum temperature among the temperatures for each of the five zones. In the example of FIG. 5, the average average (32° C.) is calculated for each of the five zones.

The vapor pressure extraction unit 101 extracts the vapor pressure of water in the processing container 10 based on the detected temperature output from the temperature acquisition unit 100. The "vapor pressure" refers to the gas pressure at which the number of molecules that become gas and the number of molecules that return to liquid are in equilibrium at the acquired detection temperature. For this reason, the vapor pressure extraction unit 101 stores in advance the water vapor pressure curve 200 corresponding to the detected temperature in an internal vapor pressure curve storage 101a.

FIG. 6 is a graph illustrating a vapor pressure curve 200 for water. As illustrated in FIG. 6, in the vapor pressure curve 200 of water, when the horizontal axis indicates the temperature and the vertical axis indicates the pressure, the pressure tends to increase non-linearly as the temperature increases. In the graph of FIG. 6, the portion that overlaps with the vapor pressure curve 200 is in a state of vapor-liquid equilibrium. The portion above the vapor pressure curve 200 is in a state where a liquid is generated by condensation of a water vapor exceeding a saturated water vapor pressure. The portion below the vapor pressure curve 200 may exist in the processing container 10 as gaseous water (water vapor). As described above, when water generated by the reaction formula (1) turns into liquid water and adheres to the inside of the processing container 10, uneven etching of the deposited film may be caused. Therefore, in the cleaning processing, the control unit 90 performs a control such that the target pressure in the processing container 10 overlaps with the vapor pressure curve 200 or is positioned below the vapor pressure curve 200.

Specifically, when the vapor pressure extraction unit 101 receives the detected temperature from the temperature acquisition unit 100, the vapor pressure extraction unit 101 reads out the vapor pressure curve 200 stored in the vapor pressure curve storage 101a and recognizes the vapor pressure that overlaps with the vapor pressure curve 200 (hereinafter, also referred to as a pressure for calculation). That is, the vapor pressure extraction unit 101 passes through the vapor pressure curve 200 as indicated by the dashed line in FIG. 6, and extracts the pressure for calculation (35.7 Torr≈4759.61 Pa) at which the vapor-liquid equilibrium is achieved at the acquired detection temperature (e.g., 32° C.). Then, the vapor pressure extraction unit 101 outputs the extracted pressure for calculation to the pressure calculation unit 102.

When receiving the pressure for calculation from the vapor pressure extraction unit 101, the pressure calculation unit 102 calculates a target pressure for adjusting the pressure in the processing container 10 based on the pressure for calculation. The target pressure may be calculated taking into consideration the etching rate in the cleaning processing.

Figure 7:
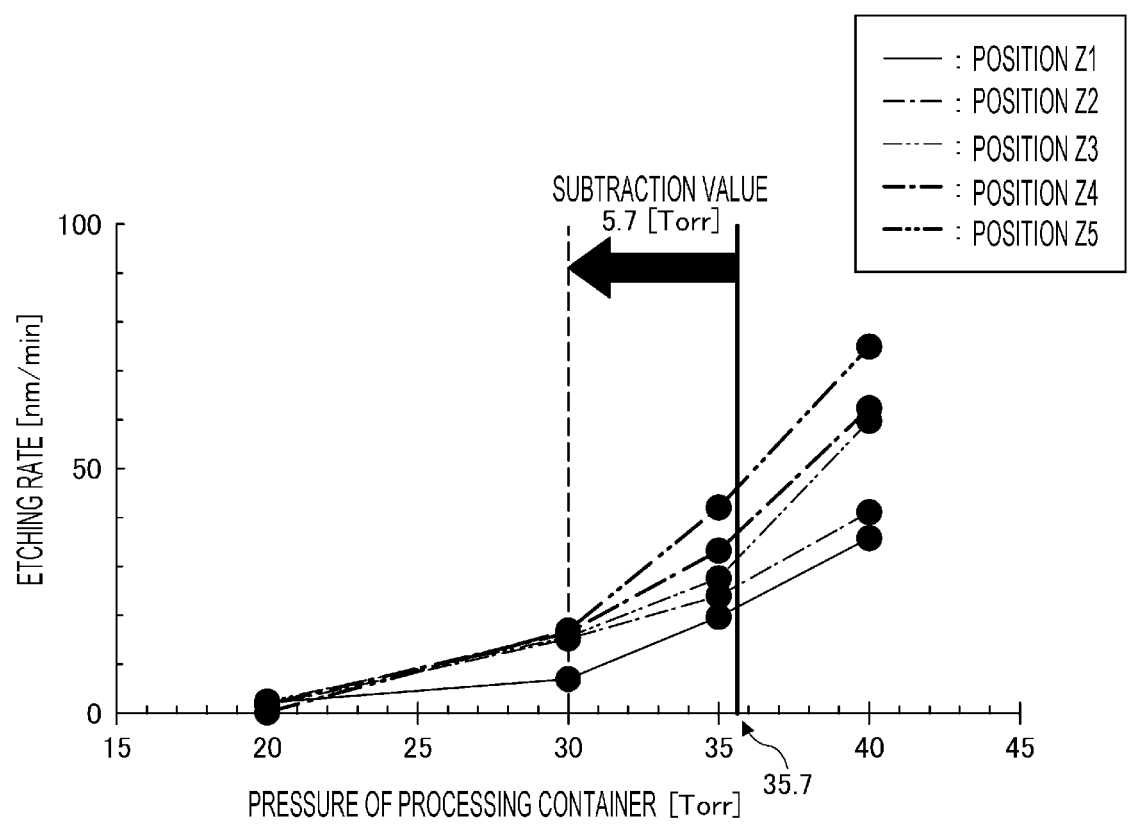
FIG. 7 is a graph illustrating a relationship between the pressure in the processing container and the etching rate when the detection temperature of the cleaning processing is 32° C.

FIG. 7 is a graph illustrating a relationship between the pressure in the processing container and the etching rate when the detection temperature of the cleaning processing is 32° C. In the graph illustrated in FIG. 7, the horizontal axis indicates the pressure in the processing container 10, and the vertical axis indicates the etching rate. A solid line in FIG. 7 indicates the etching rate at the top plate position Z1 (see, e.g., FIG. 2) of the wafer boat 16. A one-dot line in FIG. 7 indicates the etching rate at the uppermost position Z2 (see, e.g., FIG. 2) of the small fin 29 of the heat insulation unit 27. A two-dot chain line in FIG. 7 indicates the etching rate at the uppermost position Z3 (see, e.g., FIG. 2) of the large fin 28 of the heat insulation unit 27. A thick one-dot chain line in FIG. 7 indicates the etching rate at the lowermost position Z4 (see, e.g., FIG. 2) of the large fin 28 of the heat insulation unit 27. A thick two-dot chain line in FIG. 7 indicates the etching rate at the position Z5 (see, e.g., FIG. 2) of the cover 21.

As illustrated in FIG. 7, it may be seen that in the cleaning processing, the etching rate increases as the pressure in the processing container 10 increases. However, it may be seen that the etching rates at the positions Z1 to Z5 tend to separate from each other as the pressure in the processing container 10 increases.

Specifically, looking at the etching rate at a pressure of 40 Torr (≈5332.89 Pa) in the graph of FIG. 7, there is a large difference in etching rate among the positions Z1 to Z5 (e.g., a difference between the maximum value and the minimum value of the etching rate is 40 nm/min or more). Further, looking at the etching rate at a pressure of 35 Torr (≈4666.28 Pa), there is a difference in etching rate among the positions Z1 to Z5. That is, in the processing container 10, the lower side in the vertical direction (near the heat insulation unit 27) corresponds to a region where the temperature tends to decrease and water tends to exist more. Therefore, the etching rate tends to increase downward in the vertical direction. In particular, the position Z5 of the upper surface of the cover 21 tends to have the lowest temperature in the processing container 10, and liquid water is generated to facilitate etching.

Meanwhile, looking at the etching rate at a pressure of 30 Torr (≈3999.67 Pa) in the graph of FIG. 7, it may be said that although the etching rate at the position Z1 is slightly low, the etching rates at the positions Z2 to Z5 are generally the same. That is, when the pressure in the processing container 10 is around 30 Torr, uniform etching may proceed. Further, it may be seen that at a pressure of 20 Torr (≈2666.45 Pa), the etching rates at the respective positions Z1 to Z5 are substantially the same, but the etching rate itself is low.

From the above, when calculating the target pressure, the pressure calculation unit 102 calculates a pressure at which the etching rate is increased to a certain extent while giving priority to the uniformity of the etching rate. Therefore, the pressure calculation unit 102 may calculate the target pressure such that the value is slightly lower than the vapor pressure curve 200.

A method of calculating the target pressure is not particularly limited, and for example, subtracting a predetermined subtraction value Sv from the pressure for calculation (vapor pressure) may be mentioned. The subtraction value Sv may be stored in advance in a calculation storage 102a by performing an experiment using the processing container 10 having the same shape. The subtraction value Sv is set to a value such that a difference between the maximum value and the minimum value of the etching rate at each of the positions Z1 to Z5 set in the processing container 10 is 20 nm/min or less in the cleaning processing. For example, when the detected temperature is 32° C. and the pressure in the processing container 10 is 35 Torr as illustrated in FIG. 7, the difference between the etching rate (maximum value) at the position Z5 and the etching rate (minimum value) at the position Z1 is greater than 20 nm/min. Meanwhile, when the difference is 33 Torr (≈≒ 4399.64 Pa) or less, the difference between the etching rate at the position Z5 and the etching rate at the position Z1 is 20 nm/min or less. Therefore, the subtraction value Sv may be set to a value greater than 2.7 Torr such that the target pressure is 33 Torr or less.

The control unit 90 may have map information in which the pressure of the processing container 10 is associated with the etching rate for each of a plurality of detected temperatures, and refer to the map information corresponding to the detected temperature when obtaining the detected temperature. That is, the control unit 90 may set the target pressure at which the difference between the maximum value and the minimum value of the etching rate is 20 nm/min or less and the uneven etching may be suppressed based on the map information.

Further, in order to achieve both suppression of etching unevenness and securing of etching rate, the subtraction value Sv may be set to a value in the range of 1 Torr to 10 Torr. As an example, in FIG. 7, the pressure calculation unit 102 stores in advance 5.7 Torr (≈759.937 Pa) as the subtraction value Sv, and subtracts 5.7 Torr when acquiring the pressure for calculation.

As illustrated in FIG. 3, the vapor pressure (pressure for calculation) of each apparatus A to E varies according to the detected temperature. The pressure calculation unit 102 may obtain the target pressure by subtracting the same subtraction value Sv (e.g., 5.7 Torr) from the pressure for calculation corresponding to the detected temperature. Further, in FIG. 3, the pressure calculation unit 102 performs a processing of rounding off the target pressure after subtracting the subtraction value Sv from the pressure for calculation. Thus, the target pressure may be set to a natural number, and the pressure control by the exhaust unit 40 may be simplified.

Alternatively, the subtraction value Sv may be a variable value instead of a fixed value or may be set by a user of the processing apparatus 1. For example, when the detected temperature is high, a large subtraction value Sv is set, and when the detected temperature is low, a small subtraction value Sv is set. Further, the subtraction value Sv may vary based on the cleaning processing time set according to the recipe. For example, when the cleaning processing time is set to be long, suppression of uneven etching of the deposited film may be given priority by setting a large subtraction value Sv to make the target pressure sufficiently lower than the vapor pressure curve 200. In contrast, when the cleaning processing time is set to be short, processing efficiency may be given priority by setting a small subtraction value Sv to set a target pressure close to the vapor pressure curve 200.

The target pressure may be the vapor pressure that overlaps with the vapor pressure curve 200 (i.e., the vapor-liquid equilibrium pressure). In this case, the pressure calculation unit 102 sets the target pressure as it is without subtracting the extracted vapor pressure. Thus, the processing apparatus 1 may further shorten the period of the cleaning processing. In other words, the control unit 90 may set a target pressure equal to or lower than the vapor pressure curve 200 in consideration of the uniformity of etching and the etching rate.

The pressure control unit 103 adjusts an opening degree of the pressure regulating valve 43 of the exhaust unit 40 based on the target pressure calculated by the pressure calculation unit 102. Further, the gas supply control unit 104 controls each component of the gas supply unit 30 (i.e., a flow rate controller, an on-off valve, etc. installed in the gas nozzle 32) to adjust the amount of a fluorine-containing gas supplied into the processing container 10. As a result, the pressure in the processing container 10 is adjusted to the target pressure, and the cleaning processing may be stably performed in the processing apparatus 1.

Figure 8:
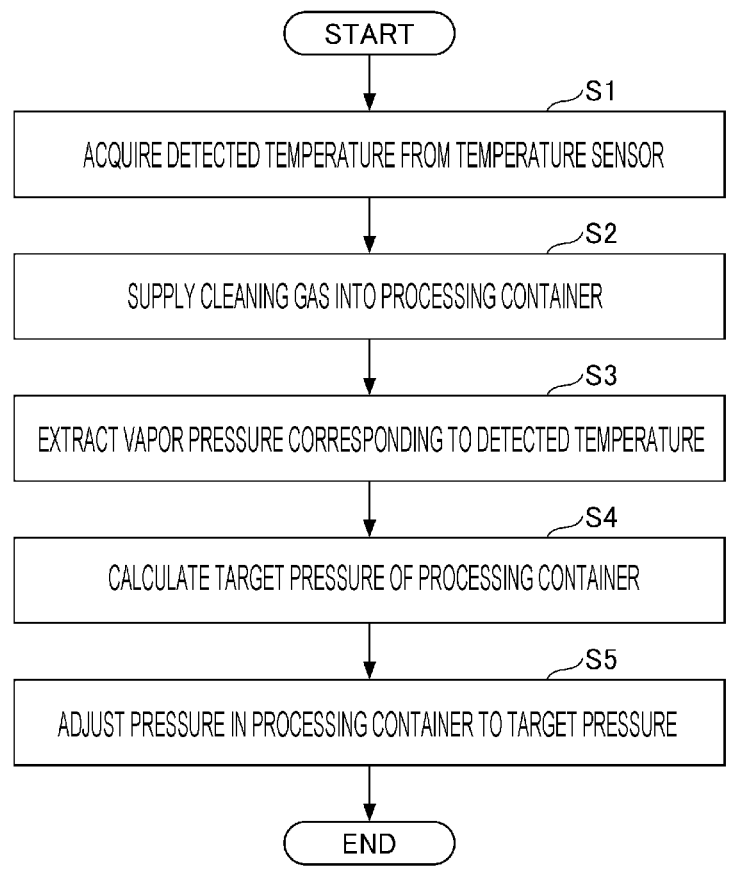
FIG. 8 is a flow chart illustrating an example of the cleaning processing.

The processing apparatus 1 of the present disclosure is basically configured as described above, and the operation of the cleaning processing (cleaning processing method) will be described below with reference to FIG. 8. FIG. 8 is a flow chart illustrating an example of the cleaning processing method.

The control unit 90 performs the cleaning processing at an appropriate timing, such as when the processing apparatus 1 is started or stopped, or a time point between one substrate processing and another substrate processing. As a preparation stage for the cleaning processing, the control unit 90 raises the elevating mechanism 25 to seal the processing container 10 with the cover 21 in a state where the wafer boat 16 accommodates dummy wafers or where the wafer boat 16 is empty. The processing apparatus 1 may perform the cleaning processing in a state where the wafer boat 16 does not exist in the processing container 10.

Further, as described above, the control unit 90 stops the operation of the heating unit 50. As a result, the temperature of the processing container 10 changes under the influence of the surrounding environment of the processing apparatus 1.

Therefore, in the cleaning processing method, the temperature acquisition unit 100 of the control unit 90 detects the temperature in the processing container 10 with the temperature sensor 70 and acquires the detected temperature from the temperature sensor 70 (step S1). At this time, the temperature sensor 70 detects a temperature for each of a plurality of zones using the thermometers 71 to 75 and transmits the detected temperature to the control unit 90. Thus, the temperature acquisition unit 100 stores the temperature of each zone in the memory 92 and outputs one detected temperature to the vapor pressure extraction unit 101 based on a predetermined selection method or calculation method.

Further, the gas supply control unit 104 of the control unit 90 supplies a cleaning gas such as HF into the processing container 10 through the gas nozzle 32 by controlling the gas supply unit 30 (step S2).

The vapor pressure extraction unit 101 of the control unit 90 refers to the vapor pressure curve 200 stored in the vapor pressure curve storage 101a and extracts the vapor pressure corresponding to the detected temperature received from the temperature acquisition unit 100 (step S3). Then, the vapor pressure extraction unit 101 outputs the extracted vapor pressure to the pressure calculation unit 102 as a pressure for calculation.

Further, the pressure calculation unit 102 calculates the target pressure of the processing container 10 using the pressure for calculation which is input from the vapor pressure extraction unit (step S4). The pressure calculation unit 102 calculates the target pressure by subtracting a subtraction value Sv of 5.7 Torr from the pressure for calculation as illustrated in, for example, FIG. 7. The pressure calculation unit 102 outputs the calculated target pressure to the pressure control unit 103.

The pressure control unit 103 controls the operation of the pressure regulating valve 43 and the vacuum pump 44 of the exhaust unit 40 based on the target pressure input from the pressure calculation unit 102 such that the pressure in the processing container 10 becomes the target pressure (step S5). Further, the gas supply control unit 104 of the control unit 90 may control the gas supply unit 30 based on the target pressure to adjust the supply amount of the cleaning gas. As a result, the pressure in the processing container 10 during the cleaning processing is maintained at the target pressure. Therefore, the water generated in the processing container 10 exists as water vapor without being condensed.

That is, in the processing container 10, the reactions of the reaction formulas (1) to (3) may be promoted while maintaining water vapor. As a result, it is possible to suppress etching unevenness of each component in the processing container 10. Further, when the processing apparatus 1 sets the target pressure close to the vapor pressure, it is possible to secure the etching rate of the cleaning processing to a certain extent, so that it is possible to suppress the deterioration of the working efficiency.

The control unit 90 may continuously repeat the above processing flow during the cleaning processing. As a result, even when the temperature in the processing container 10 changes, it is possible to immediately adjust the pressure to an appropriate target pressure, so that the water vapor in the processing container 10 may be stably maintained. Alternatively, when the target pressure is set according to the above processing flow at the start of the cleaning processing, the control unit 90 may maintain the target pressure during the cleaning processing. As a result, the processing apparatus 1 may suppress fluctuation of the target pressure in a short period, thereby stabilizing the processing.

The technical ideas and effects of the present disclosure described in the above embodiments will be described below.

According to a first aspect of the present disclosure, a processing apparatus 1 includes: a processing container 10; a temperature sensor 70 that detects a temperature in the processing container 10; a gas supply unit 30 that supplies a fluorine-containing cleaning gas into the processing container 10; a pressure regulation unit (gas supply unit 30) that regulates a pressure in the processing container 10; and a control unit 90 that controls the gas supply unit 30 and the pressure regulation unit to perform a cleaning processing of removing a deposited film in the processing container 10. The control unit 90 stores, in a storage (vapor pressure curve storage 101a), a vapor pressure curve 200 in which the temperature in the processing container 10 is associated with a vapor pressure of water in the processing container 10. In the cleaning processing, the control unit 90 refers to the storage, sets a target pressure below the vapor pressure curve 200 based on the temperature detected by the temperature sensor 70 and the vapor pressure curve 200, and controls the pressure regulation unit such that the pressure in the processing container 10 becomes the target pressure.

According to the above, the processing apparatus 1 sets a target pressure below the vapor pressure curve 200 based on the temperature detected by the temperature sensor 70, and adjusts the inside of the processing container 10 to the target pressure, thereby suppressing condensation of water inside the processing container 10 in the cleaning processing. As a result, the processing apparatus 1 may suppress etching unevenness due to the fluorine-containing gas and water and perform the cleaning processing stably. For example, the processing apparatus 1 may effectively suppress damage to structures within the processing container 10.

The control unit 90 refers to the storage (vapor pressure curve storage 101a), extracts the vapor pressure corresponding to the detected temperature based on the vapor pressure curve 200, and subtracts the subtraction value Sv from the extracted vapor pressure to calculate the target pressure. Thus, the processing apparatus 1 may easily obtain the target pressure according to the detected temperature.

Further, the subtraction value Sv is a value at which the difference between the maximum value and the minimum value of the etching rate at each of a plurality of predetermined positions (i.e., the positions Z1 to Z5) set in the processing container 10 in the cleaning processing is 20 nm/min or less. As a result, the processing apparatus 1 may more uniformly etch the inside of the processing container 10.

Further, the subtraction value Sv is set to a value in the range of 1 Torr to 10 Torr. As a result, the processing apparatus 1 may secure the etching rate of the processing container 10 while suppressing unevenness in etching, and may improve the efficiency of the processing.

Further, the subtraction value Sv is a fluctuation value that fluctuates according to the extracted vapor pressure or the processing time of the cleaning processing. As a result, the processing apparatus 1 may perform a processing at an appropriate target pressure according to the status of the cleaning processing.

Further, the control unit 90 refers to the vapor pressure curve 200 and sets the vapor pressure corresponding to the detected temperature as the target pressure. Thus, the processing apparatus 1 may set a high target pressure in the cleaning processing, thereby shortening the period of the cleaning processing.

Further, the temperature sensor 70 detects the temperature of each of a plurality of zones in the processing container 10, and the control unit 90 sets one of the average value, maximum value, minimum value, and median value as the detected temperature based on the temperatures of the plurality of zones acquired from the temperature sensor 70. Thus, the processing apparatus 1 may accurately obtain the target pressure that follows the temperature in the processing container 10.

The processing container 10 performs a substrate processing of forming a silicon oxide film on the substrate W. In the cleaning processing, the processing container 10 removes the silicon oxide film as a deposited film deposited in the processing container 10. Thus, the processing apparatus 1 may stably etch the deposition film of the silicon oxide film in the processing container 10.

According to a second aspect of the present disclosure, a cleaning processing method includes: obtaining a temperature in a processing container 10; supplying a fluorine-containing cleaning gas into the processing container 10; setting a target pressure below a vapor pressure curve 200 based on a detected temperature and the vapor pressure curve 200 in which the temperature in the processing container 10 is associated with a vapor pressure of water in the processing container 10; and regulating a pressure in the processing container 10 such that the pressure in the processing container 10 becomes the target pressure, thereby removing a deposited film in the processing container 10. Thus, the cleaning processing method may perform the cleaning processing more stably.

The processing apparatus 1 of the present disclosure is not limited to a vertical processing apparatus that processes a plurality of substrates W at the same time, may be a horizontal processing apparatus, and may be applied to a cleaning processing of a single-wafer apparatus that processes the substrates W one by one. For example, the processing apparatus 1 is applicable to any type of apparatuses among an atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP).

According to an aspect of the present disclosure, a cleaning processing may be stably performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising:
a processing container;
a temperature sensor configured to detect a temperature in the processing container;
a gas supply configured to supply a cleaning gas into the processing container;
a pressure regulator configured to regulate a pressure in the processing container; and
a controller configured to control an overall operation of the processing apparatus,
wherein the controller is configured to:
store, in a storage, a vapor pressure curve in which the temperature in the processing container is associated with a vapor pressure of water in the processing container,
refer to the storage, set a target pressure below the vapor pressure curve based on the temperature detected by the temperature sensor and the vapor pressure curve, and
perform a cleaning processing of removing a deposited film in the processing container by controlling the pressure regulator such that the pressure in the processing container becomes the target pressure.

2. The processing apparatus according to claim 1, wherein the controller refers to the storage and extracts a vapor pressure corresponding to the detected temperature based on the vapor pressure curve, and
the target pressure is calculated by subtracting a subtraction value from the extracted vapor pressure.

3. The processing apparatus according to claim 2, wherein in the cleaning processing, the subtraction value is a value such that a difference between a maximum value and a minimum value of an etching rate at each of a plurality of predetermined positions set in the processing container is 20 nm/min or less.

4. The processing apparatus according to claim 2, wherein the subtraction value is set to a value in a range of 1 Torr to 10 Torr.

5. The processing apparatus according to claim 2, wherein the subtraction value is a fluctuation value that fluctuates according to the extracted vapor pressure or a processing time of the cleaning processing.

6. The processing apparatus according to claim 1, wherein the temperature sensor detects a temperature for each of a plurality of zones in the processing container, and
the controller sets any one of an average value, a maximum value, and a median value as the detected temperature based on the temperature for each of the plurality of zones obtained from the temperature sensor.

7. The processing apparatus according to claim 1, wherein a substrate processing is performed in the processing container to form a silicon oxide film on a substrate, and
in the cleaning processing, the silicon oxide film deposited in the processing container is removed.

8. A processing apparatus comprising:
a processing container;
a temperature sensor configured to detect a temperature in the processing container;
a gas supply configured to supply a cleaning gas into the processing container;
a pressure regulator configured to regulate a pressure in the processing container; and
a controller configured to control an overall operation of the processing apparatus,
wherein the controller is configured to:
store, in a storage, a vapor pressure curve in which the temperature in the processing container is associated with a vapor pressure of water in the processing container,
refer to the storage, set a target pressure equal to the vapor pressure curve based on the temperature detected by the temperature sensor and the vapor pressure curve, and
perform a cleaning processing of removing a deposited film in the processing container by controlling the pressure regulator such that the pressure in the processing container become the target pressure.

9. A cleaning processing method comprising:
obtaining a temperature in a processing container using a temperature sensor;
supplying a fluorine-containing cleaning gas into the processing container;
setting a target pressure below a vapor pressure curve based on the temperature obtained by the temperature sensor in the obtaining and the vapor pressure curve in which the temperature in the processing container is associated with a vapor pressure of water in the processing container; and
removing a deposited film in the processing container by regulating a pressure in the processing container such that the pressure in the processing container becomes the target pressure.

* * * * *